(12) United States Patent
Lu et al.

(10) Patent No.: US 12,354,994 B2
(45) Date of Patent: Jul. 8, 2025

(54) THREE-DIMENSIONAL MEMORY DEVICE AND FABRICATION METHOD

(71) Applicant: Yangtze Memory Technologies Co., Ltd., Wuhan (CN)

(72) Inventors: Zhiyong Lu, Wuhan (CN); Sheng Peng, Wuhan (CN); Kai Yu, Wuhan (CN); Wenbo Zhang, Wuhan (CN); Yang Zhou, Wuhan (CN); Jing Gao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 425 days.

(21) Appl. No.: 17/838,910

(22) Filed: Jun. 13, 2022

(65) Prior Publication Data

US 2023/0402425 A1    Dec. 14, 2023

(51) Int. Cl.
*H01L 25/065* (2023.01)
*H01L 23/00* (2006.01)
*H01L 25/00* (2006.01)
*H01L 25/18* (2023.01)

(52) U.S. Cl.
CPC ............ *H01L 24/80* (2013.01); *H01L 24/08* (2013.01); *H01L 25/0657* (2013.01); *H01L 25/18* (2013.01); *H01L 25/50* (2013.01); *H01L 2224/08145* (2013.01); *H01L 2224/80048* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... H01L 24/80; H01L 24/08; H01L 25/0657; H01L 25/18; H01L 5/50; H01L 2224/08145; H01L 2224/80048; H01L 2224/80895; H01L 2224/80896; H01L 2924/1431; H01L 2924/14511; H10B 43/27; H10B 43/40
See application file for complete search history.

(56) References Cited

U.S. PATENT DOCUMENTS

| | | | |
|---|---|---|---|
| 10,224,240 B1* | 3/2019 | Funayama | H10B 41/27 |
| 2022/0406810 A1* | 12/2022 | Okuda | H10B 43/40 |
| 2023/0035421 A1* | 2/2023 | Lim | H10B 41/35 |

* cited by examiner

*Primary Examiner* — Thanh Y. Tran
(74) *Attorney, Agent, or Firm* — Anova Law Group, PLLC

(57) ABSTRACT

Three-dimensional (3D) NAND memory devices and methods are provided. In one aspect, a fabrication method includes forming a conductor/insulator stack over a substrate, forming a dielectric layer of a dielectric material including atomic hydrogen over a part of the conductor/insulator stack, and performing a thermal process to release the atomic hydrogen from the dielectric material and diffuse the atomic hydrogen into the conductor/insulator stack.

20 Claims, 12 Drawing Sheets

US 12,354,994 B2

THREE-DIMENSIONAL MEMORY DEVICE AND FABRICATION METHOD

FIELD OF THE TECHNOLOGY

This application relates generally to the field of semiconductor technology and, specifically, to a three-dimensional (3D) memory device and fabrication method.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

Memory cells of a 3D NAND device often contain certain defects such as dangling bonds and shallow traps. These defects affect the performance and cause reliability issues.

SUMMARY

In one aspect of the present disclosure, a method for fabricating a 3D memory device includes forming a conductor/insulator stack over a substrate, forming a dielectric layer of a dielectric material including atomic hydrogen over the conductor/insulator stack, and performing a thermal process to release the atomic hydrogen from the dielectric material and diffuse the atomic hydrogen into the conductor/insulator stack.

In another aspect of the present disclosure, a 3D memory device includes a conductor/insulator stack, a dielectric layer of a dielectric material including atomic hydrogen, and vias through the dielectric layer. The dielectric layer is proximate to the conductor/insulator stack.

In another aspect of the present disclosure, a memory apparatus includes an input/output (I/O) component for receiving an input, a buffer for buffering a signal, a controller for implementing an operation, and a three-dimensional (3D) memory device. The 3D memory device includes a conductor/insulator stack, a dielectric layer of a dielectric material including atomic hydrogen, and vias through the dielectric layer. The dielectric layer is proximate to the conductor/insulator stack.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

Figure 1:
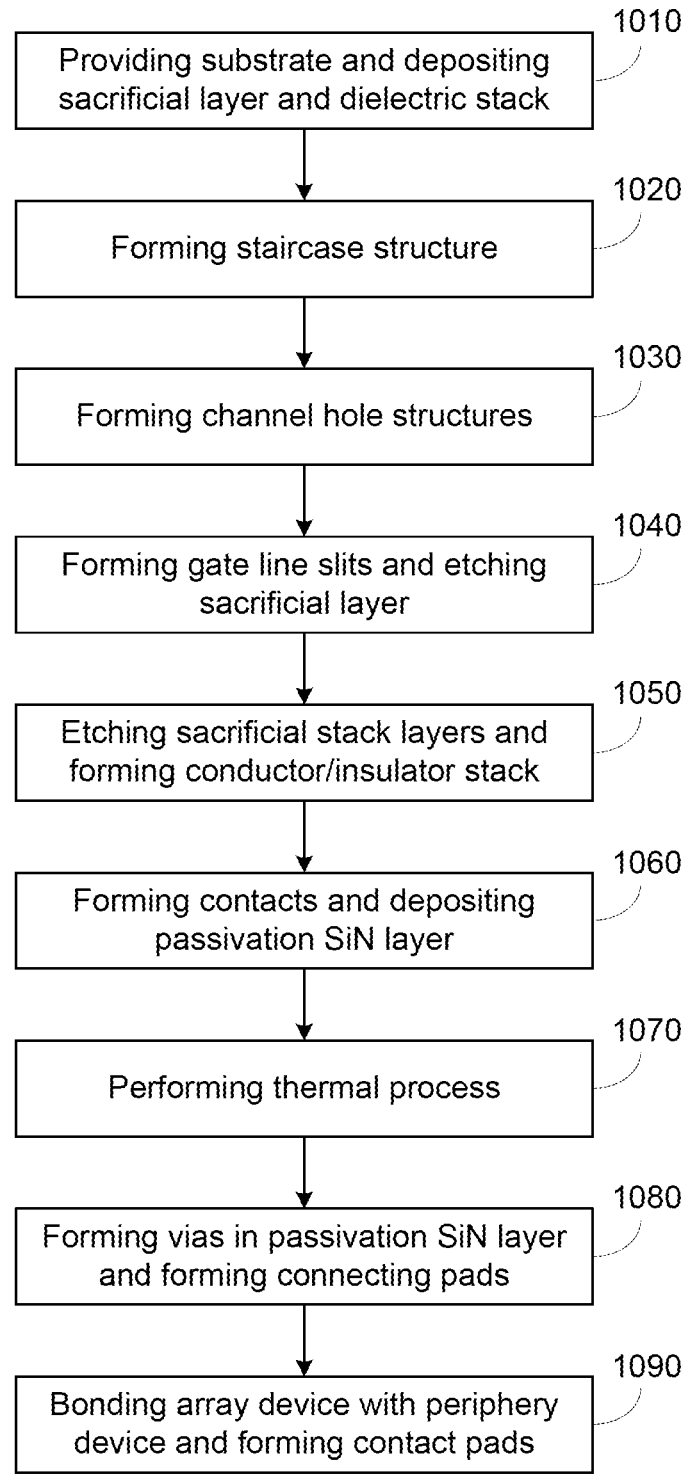
FIG. 1 illustrates a schematic flow chart of a fabrication process of an exemplary three-dimensional (3D) memory device according to various aspects of the present disclosure.
Figure 2:
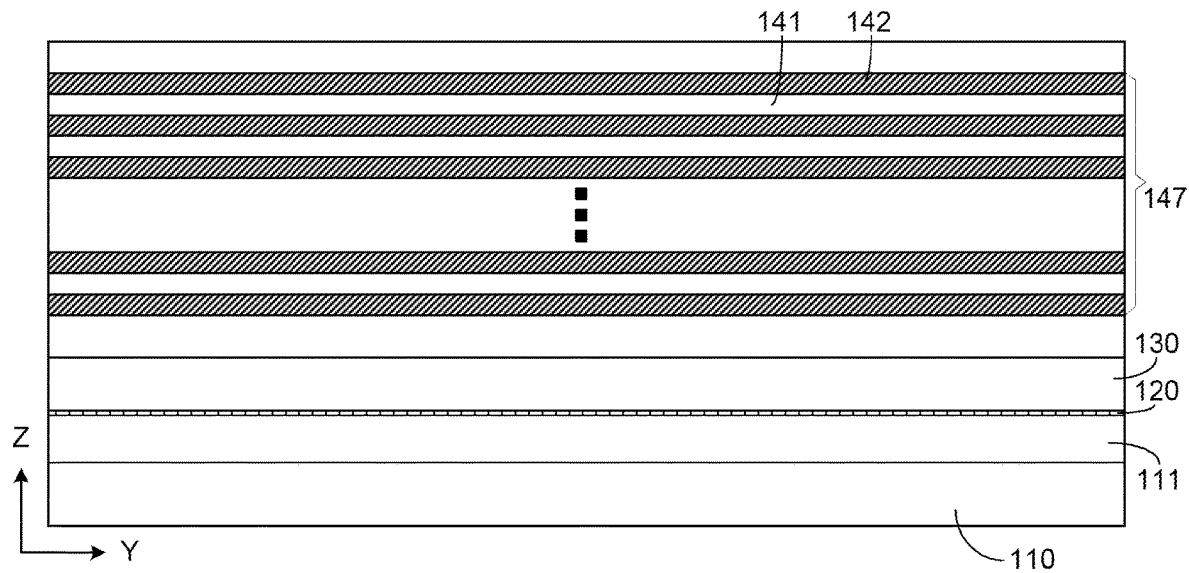
FIGS. 2 and 3 illustrate cross-sectional views of structures of the 3D memory device at certain stages during the fabrication process according to various aspects of the present disclosure.

FIG. 1 shows a schematic flow chart 1000 of a fabrication process for making a 3D memory device 190 according to aspects of the present disclosure. FIG. 2 shows a cross-sectional view of a structure of the 3D memory device 190 at a certain stage during the fabrication process. Among FIG. 1 and other figures in the present disclosure, top views are in an X-Y plane and cross-sectional views are in a Y-Z plane or along a line in the X-Y plane.

At 1010, a substrate 110 is provided for fabricating the 3D memory device 190. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a top portion of the substrate 110 is doped by n-type dopants via ion implantation and/or diffusion to form a doped region 111. The dopants of the doped region 111 may include, for example, phosphorus (P), arsenic (As), and/or antimony (Sb). As shown in FIG. 2, a layer 120 is deposited over the doped region 111. The layer 120 is a sacrificial layer and may include a single layer or a multilayer. For example, the layer 120 may include one or more of silicon oxide layer and silicon nitride layer. The layer 120 may be deposited by chemical vapor deposition (CVD), physical vapor deposition (PVD), atomic layer deposition (ALD), or a combination thereof. Further, CVD may include plasma enhanced CVD (PECVD). In some other aspects, the layer 120 may include another material such as aluminum oxide.

Further, over the layer 120, a sacrificial layer 130 is deposited. The sacrificial layer 130 may include a dielectric material, a semiconductor material, or a conductive material. The word "conductive", as used herein, indicates electrically conductive. An exemplary material for the sacrificial layer 130 is polysilicon.

After the polysilicon sacrificial layer 130 is formed, a dielectric stack 147 is formed. The dielectric stack 147 includes multiple pairs of stack layers, for example, including first dielectric layers 141 and second dielectric layers 142, stacked alternately over each other. Some layers of the dielectric stack are used to form memory cells. For example, the layers for fabricating memory cells may include 64 pairs, 128 pairs, or more than 128 pairs of the first and second dielectric layers 141 and 142.

In some aspects, the first dielectric layers 141 and second dielectric layers 142 are made of different materials. In descriptions below, the first dielectric layer 141 includes an oxide layer (e.g., a silicon oxide layer) exemplarily, which may be used as an isolation stack layer, while the second dielectric layer 142 includes a nitride layer (e.g., a silicon nitride layer) exemplarily, which may be used as a sacrificial stack layer. The sacrificial stack layer will be subsequently etched out and replaced by a conductive stack layer. The first dielectric layers 141 and the second dielectric layers 142 may be deposited via CVD, PVD, ALD, or a combination thereof.

Figure 3:
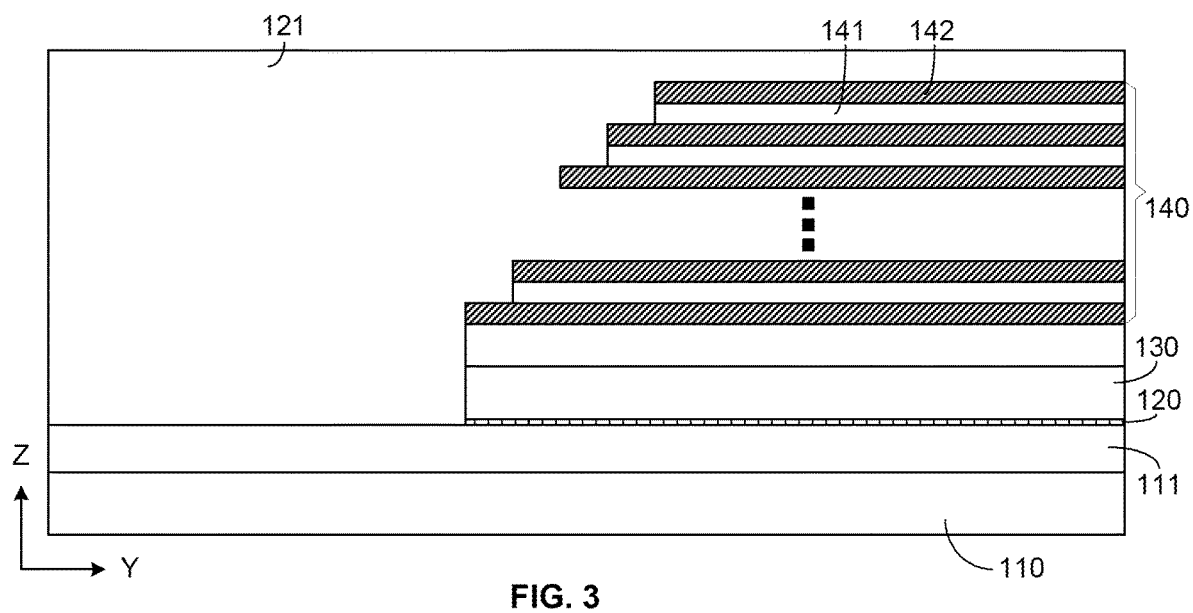

At 1020, a staircase formation process is performed to convert a portion of the dielectric stack 147 into a staircase structure. The dielectric stack 147 becomes a dielectric stack 140. FIG. 3 shows a schematic cross-sectional view of the structure of the 3D memory device 190 after the staircase structure and stack 140 are formed. Any suitable etching processes, including dry etch and/or wet etch process, may be used in the staircase formation process. For example, the height of the staircase structure may increase in a stepwise manner along the Y direction. A dielectric layer 121 is deposited to cover the staircase structure, the doped region 111, and the substrate 110. As shown in FIG. 3, a part of the dielectric stack 147, the sacrificial layer 130, and the layer 120 are removed in a region on a side of the staircase structure, e.g., on the left side of the staircase structure. The region may be viewed as a contact region where through silicon contacts connected to contact pads may be formed or an opening for contact pads may be arranged. The word "connected" as used herein, indicates electrically connected. The contact region contains a portion of the dielectric layer 121 and thus is a dielectric region. In some aspects, the layer 120 is not etched away in the staircase formation process and a portion of the layer 120 may be buried under the dielectric layer 121 in the contact region.

Figure 4:
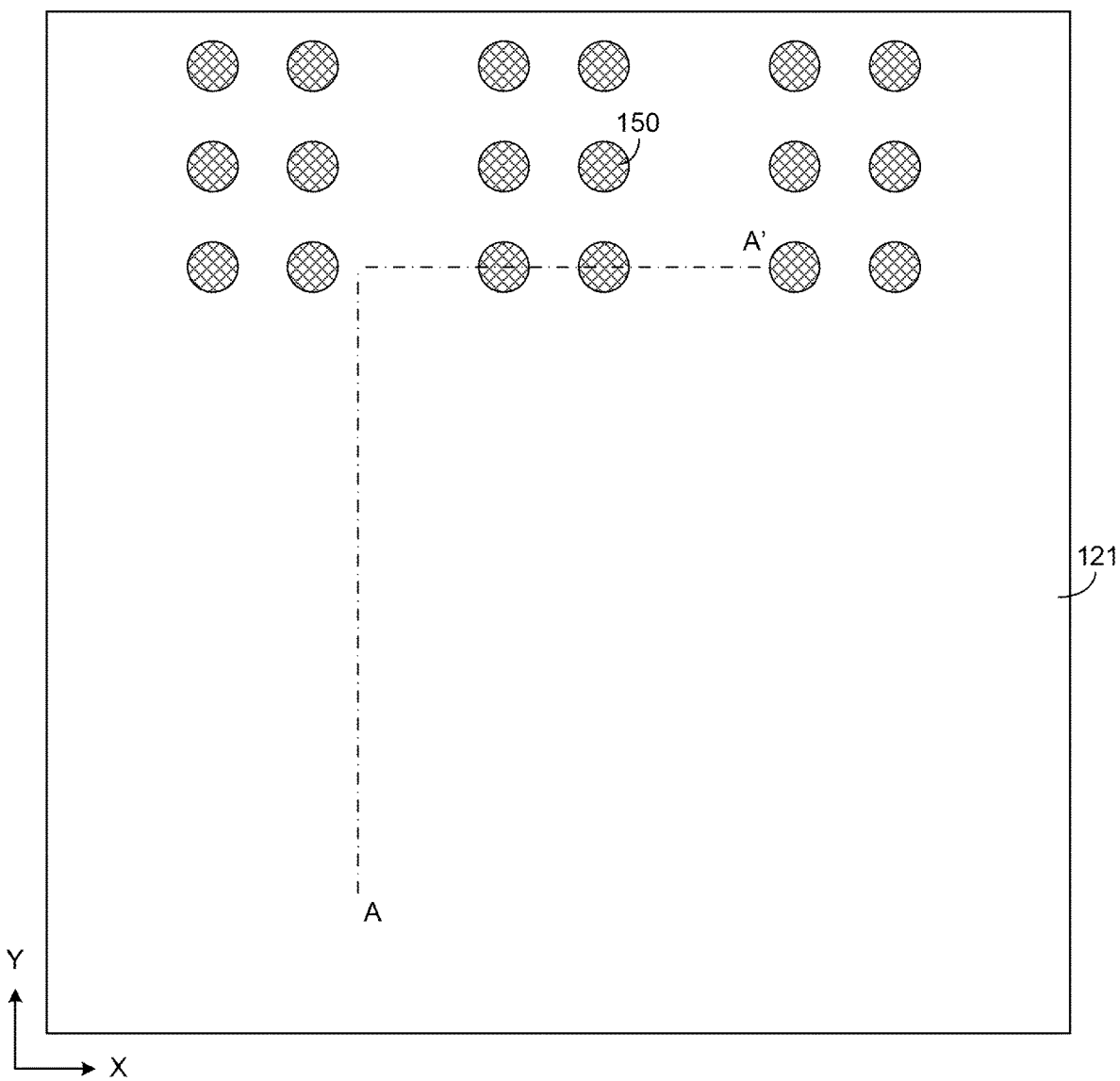
FIG. 4 illustrates a top view of a structure of the 3D memory device after channel hole structures are formed according to various aspects of the present disclosure.
Figure 5:
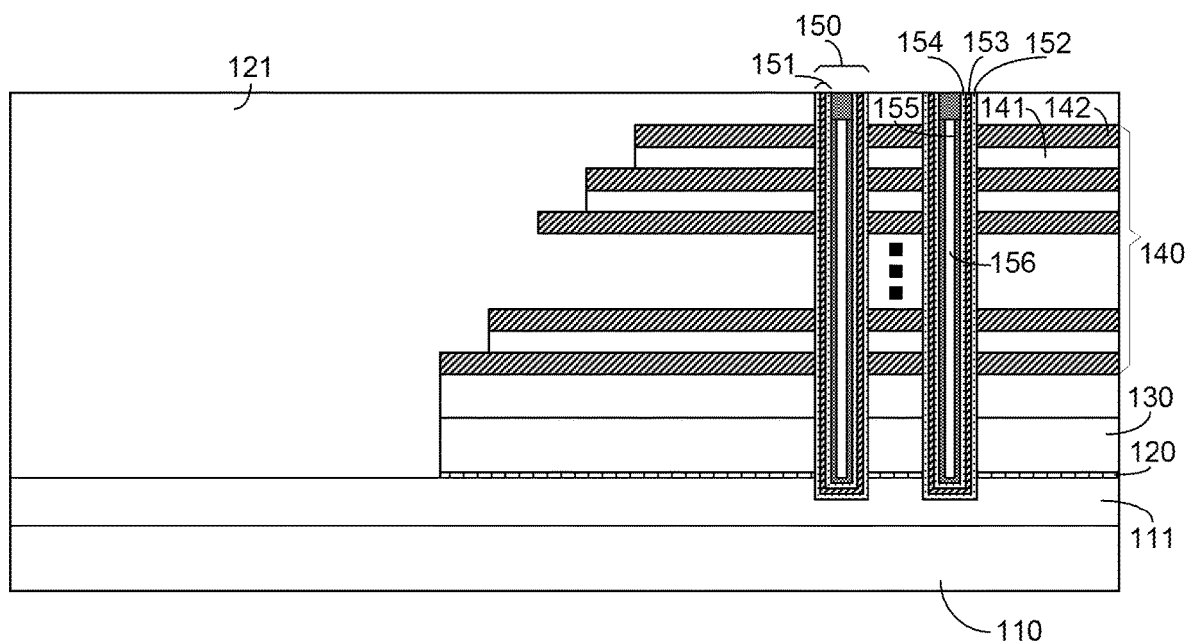
FIG. 5 illustrates a cross-sectional view along a line AA' of the top view as in FIG. 4 according to various aspects of the present disclosure.

At 1030, channel hole structures 150 are formed that extend through the dielectric stack 140 and the sacrificial layer 130 to reach portions of the substrate 110. FIGS. 4 and 5 show a schematic top view and a schematic cross-sectional view of the structure of the 3D memory device 190 after the channel hole structures 150 are fabricated according to aspects of the present disclosure. The cross-sectional view shown in FIG. 5 is taken along a line AA' of FIG. 4. The quantity, dimension, and arrangement of the channel hole structures 150 shown in FIGS. 4 and 5 and in other figures in the present disclosure are exemplary and for description purposes, although any suitable quantity, dimension, and arrangement may be used for the disclosed 3D memory device 190 according to various aspects of the present disclosure.

As shown in FIGS. 4 and 5, the channel holes are arranged to extend in the Z direction or in a direction approximately perpendicular to the substrate 110 and form an array of a predetermined pattern (not shown) in the X-Y plane. The channel holes may be formed by, for example, a dry etch process or a combination of dry and wet etch processes. Other processes may also be performed, such as a patterning process involving lithography, cleaning, and/or chemical mechanical polishing (CMP). The channel holes may have a cylinder shape or pillar shape that extends through the dielectric stack 140, the sacrificial layer 130, the layer 120, and partially penetrates the doped region 111. After the channel holes are formed, a functional layer 151 is deposited on the sidewall and bottom of the channel hole. The functional layer 151 includes a blocking layer 152 on the sidewall and bottom of the channel hole to block an outflow of charges, a charge trap layer 153 on a surface of the blocking layer 152 to store charges during an operation of the 3D memory device 190, and a tunneling layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, a high-k dielectric material such as aluminum oxide or hafnium oxide, or another wide bandgap material. The tunneling layer 154 may include one or more layers that may include one or more materials. The material for the tunneling layer 154 may include silicon oxide, silicon nitride, silicon oxynitride, a high-k dielectric material such as aluminum oxide or hafnium oxide, or another wide bandgap material.

Further, a semiconductor channel 155 is deposited on a surface of the tunneling layer 154. The semiconductor channel 155 includes a polysilicon layer in some aspects. Optionally, the semiconductor channel 155 may include an amorphous silicon layer. Like the channel holes, the semiconductor channel 155 also extends through the dielectric stack 140 and into the doped region 111. The blocking layer 152, the charge trap layer 153, the tunneling layer 154, and the semiconductor channel 155 may be deposited by, e.g., CVD and/or ALD. The structures formed in a channel hole, including the functional layer 151 and semiconductor channel 155, are referred to as a channel hole structure 150.

After the semiconductor channel 155 is formed, the opening of the channel hole structure 150 is filled by an oxide material 156 and a conductive plug, as shown in FIG. 5. The conductive plug includes a conductive material such as doped polysilicon.

In some cases, the functional layer 151 includes an oxide-nitride-oxide (ONO) structure. That is, the blocking layer 152 is a silicon oxide layer, the charge trap layer 153 is a silicon nitride layer, and the tunneling layer 154 is another silicon oxide layer. Optionally, the functional layer 151 may have a structure different from the ONO configuration. In the following descriptions, the ONO structure is used exemplarily.

Referring to FIG. 5, the channel hole structures 150 are formed after the staircase structure is formed. Optionally, the channel hole structures may also be formed before the staircase formation process. For example, after the dielectric stack 147 is fabricated as shown in FIG. 2, the channel holes may be formed and then the functional layer 151 and semiconductor channel 155 may be deposited inside the channel holes. After the channel hole structures 150 are filled with the oxide material 156, the staircase formation process may be performed to form the staircase structure.

Figure 6:
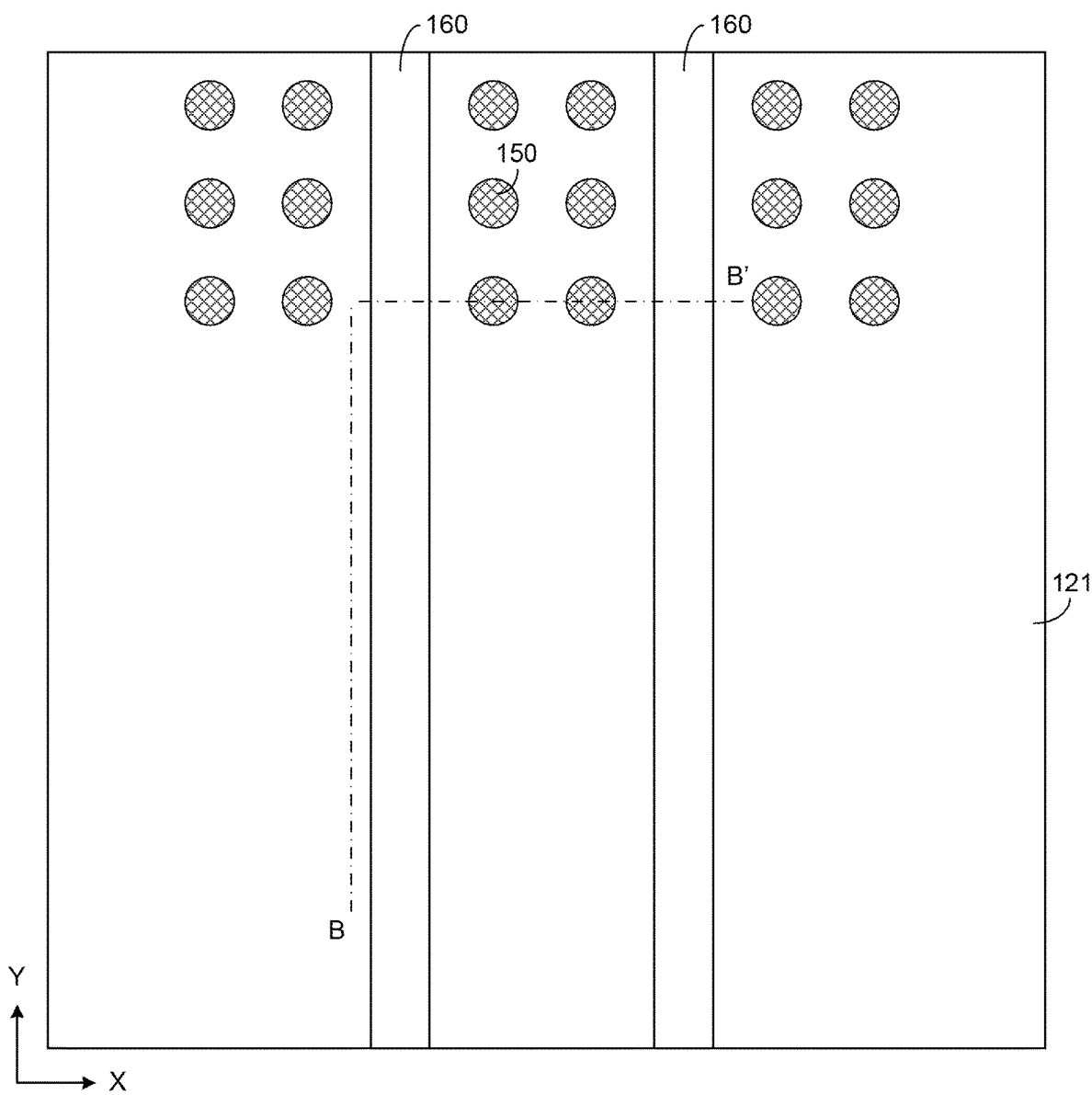
FIG. 6 illustrates a top view the 3D memory device shown in FIGS. 4 and 5 after gate line slits are formed according to various aspects of the present disclosure.
Figure 7:
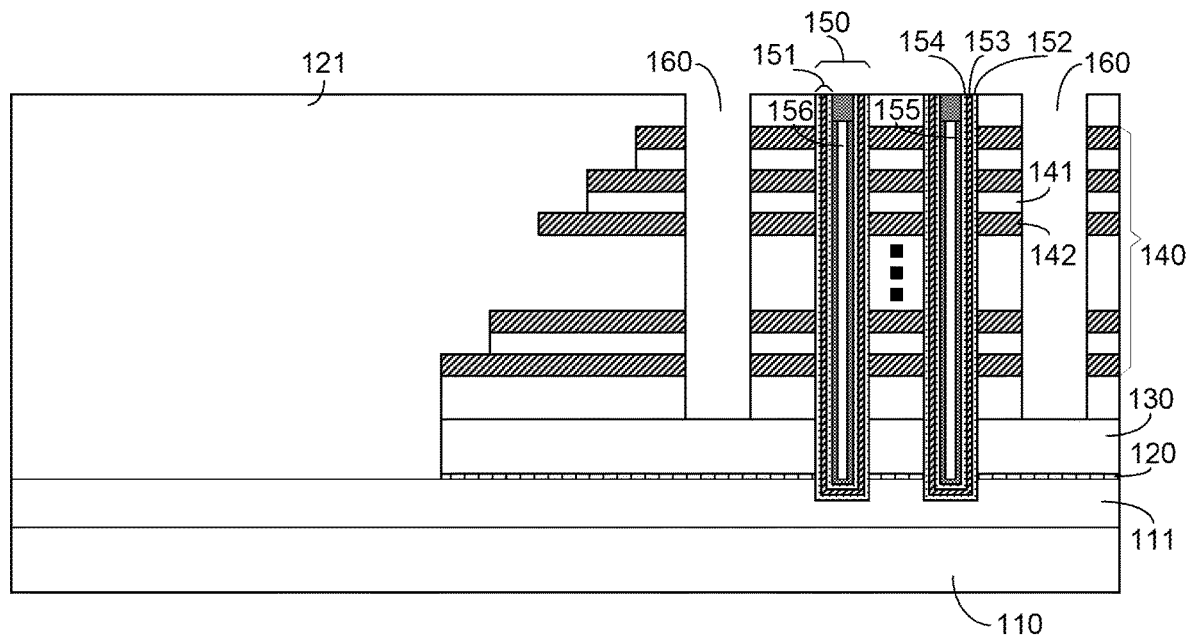
FIG. 7 illustrates a cross-sectional view along a line BB' of the top view as in FIG. 6 according to various aspects of the present disclosure.

At 1040, gate line slits 160 are formed that extend through the dielectric stack 140. FIGS. 6 and 7 show a schematic top view and a schematic cross-sectional view of the structure of the 3D memory device 190 after the gate line slits 160 are made according to aspects of the present disclosure. The cross-sectional view shown in FIG. 7 is taken along a line BB' of FIG. 6.

A gate line slit may be referred to as a gate line slit structure. The 3D memory device 190 has a great number of channel hole structures 150 arranged in memory planes (not shown). Each memory plane is divided into memory blocks (not shown) and memory fingers by the gate line slits. For example, the configuration of the channel hole structures 150 as shown in FIG. 6 may reflect memory fingers between the gate line slits 160.

The gate line slits 160 may be formed by, for example, a dry etch process or a combination of dry and wet etch processes. As shown in FIGS. 6 and 7, the gate line slits 160 extend, e.g., in the X and Y directions horizontally, and extend through the dielectric stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slit 160 by CVD and/or ALD. The spacer layers are formed to protect the first and second dielectric layers 141 and 142 and may include, for example, silicon oxide and silicon nitride.

After the spacer layers are deposited, selective etching is performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, is performed to remove the sacrificial layer 130. Removal of the sacrificial layer 130 creates a cavity and exposes the layer 120 and bottom portions of the blocking layers 152 formed in the channel hole structures 150. Further, multiple selective etch processes, e.g., multiple selective wet etch processes, are performed to remove the exposed portions of the blocking layer 152, the charge trap layer 153, and the tunneling layer 154 consecutively, which exposes bottom side portions of the semiconductor channel 155.

When the layer 120 is silicon oxide and/or silicon nitride, the layer 120 may be removed when the bottom portions of the functional layers 151 are etched away. In certain aspects, the layer 120 includes a material other than silicon oxide or silicon nitride, and the layer 120 may be removed by one or more additional selective etch processes. Removal of the layer 120 exposes the top surface of the doped region 111.

After the etch processes, the doped region 111 and side portions of the semiconductor channel 155 close to the bottom of the channel hole structure 150 are exposed in the cavity left by etching away the sacrificial layer 130 and the layer 120. The cavity is filled by a semiconductor material, e.g., polysilicon, to form a semiconductor layer 131, e.g., by a CVD and/or ALD deposition process. The semiconductor layer 131 is n-doped, formed on the exposed surface of the doped region 111 and on sidewalls or side portions of the semiconductor channel 155, and connected to the doped region 111 and the semiconductor channel 155.

Optionally, a selective epitaxial growth is performed such that a layer of single crystalline silicon may be grown on the exposed surface of the doped region 111 and a polysilicon layer may be grown on the exposed surface of the semiconductor channel 155. Thus, the semiconductor layer 131 may include adjoined layers of single crystalline silicon and polysilicon.

Figure 8:
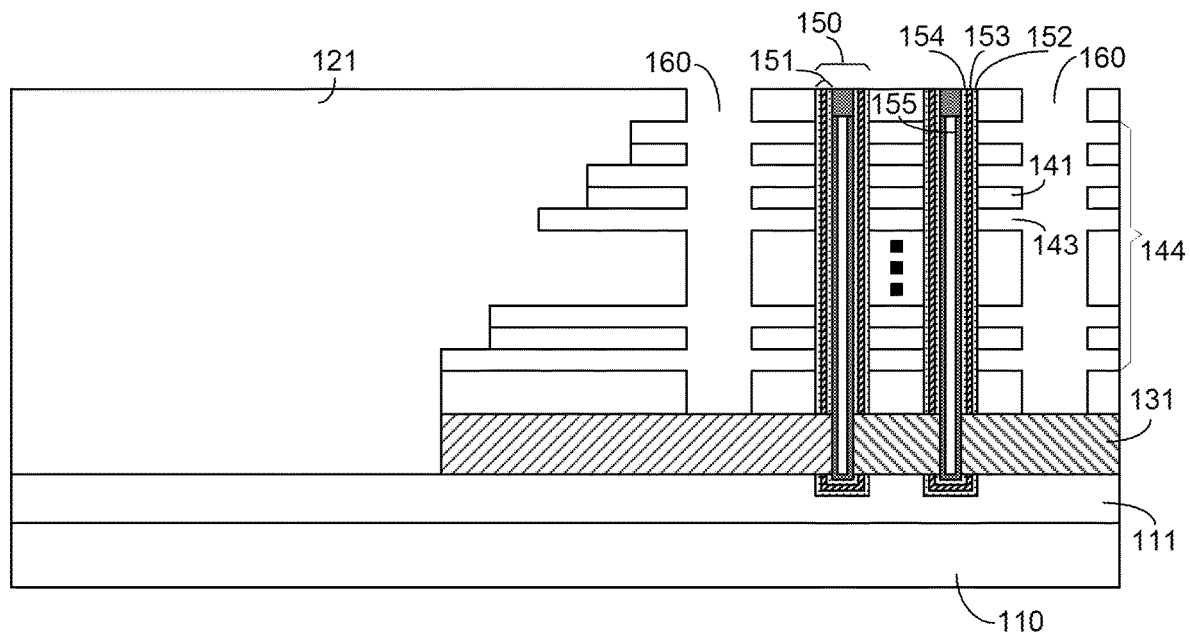
FIGS. 8, 9, and 10 illustrate cross-sectional views of the 3D memory device shown in FIGS. 6 and 7 at certain stages in the fabrication process according to various aspects of the present disclosure.

At 1050 the sacrificial stack layers are etched, as illustrated in FIG. 8. When the bottom parts of the functional layer 151 and the layer 120 are etched, some spacer layers are etched away and the rest spacer layers remain on the sidewall of the gate line slits 160 to protect the first and second dielectric layers 141 and 142. After the semiconductor layer 131 is formed, the remaining spacer layers are removed in a selective etch process, e.g., a selective wet etch process, which exposes the sides of the second dielectric layer 142 around the gate line slits 160. In some aspects, the innermost spacer layer, which is in contact with the sidewall, is silicon nitride. Because the second dielectric layers 142 as the sacrificial stack layers are also silicon nitride, the innermost spacer layer and the sacrificial stack layers may be removed together during the etch process, leaving cavities 143 between the first dielectric layers 141. The dielectric stack 140 is changed into a dielectric stack 144.

Figure 9:
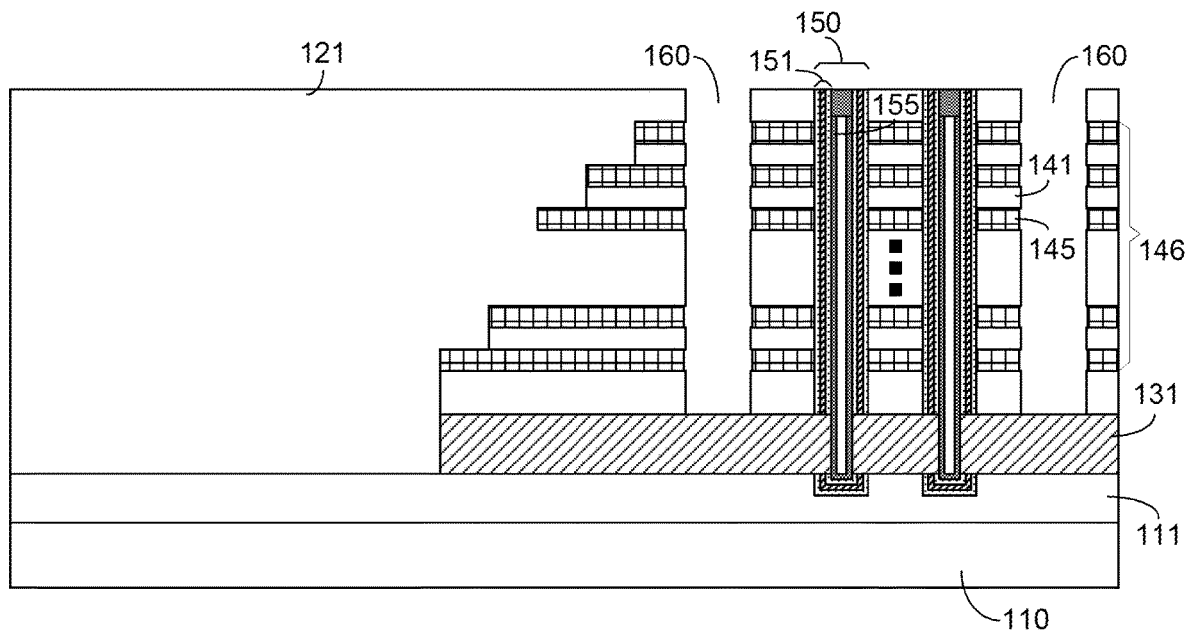

Referring to FIG. 8, the cavity 143 exposes certain portions of the blocking layer 152. Further, a conductive material such as tungsten (W) is grown to fill the cavities 143 left by the removal of the second dielectric layers 142, forming conductive layers 145 between the first dielectric layers 141. After the conductive layers 145 are fabricated, the dielectric stack 144 is converted into a conductor/insulator stack 146, as shown in FIG. 9. Similar to the dielectric stack 140, the conductor/insulator stack 146 has multiple pairs of stack layers. For example, the conductor/insulator stack 146 may include the first dielectric layers 141 and the conductive layers 145 that are alternatingly stacked over each other.

In some aspects, before metal W is deposited in the cavities 143, a dielectric layer (not shown) of a high-k dielectric material such as aluminum oxide may be deposited. Further, a layer of a conductive material such as titanium nitride (TiN) (not shown) is deposited, and then metal W is deposited to form the conductive layers 145. CVD and/or ALD may be used in the deposition processes. Alternatively, another conductive material, such as cobalt (Co), copper (Cu), aluminum (Al), titanium (Ti), tantalum (Ta), tantalum nitride (TaN), doped silicon, or any combination thereof, may be used to form the conductive layers 145.

Referring to FIG. 9, a portion of each functional layer 151 in a channel hole structure 150 is between a portion of one of the conductive layers 145 and a portion of a semiconductor channel 155 in the channel hole structure 150. Each conductive layer 145 is formed to connect rows of NAND memory cells in an X-Y plane and is designed as a word line for the 3D memory device 190. The semiconductor channel 155 in the channel hole structure 150 is formed to connect a column or a string of NAND memory cells along the Z direction and designed as a bit line for the 3D memory device 190. As such, a portion of the functional layer 151 in the channel hole structure 150 in the X-Y plane, as a part of a NAND memory cell, is arranged between a conductive layer 145 and a semiconductor channel 155, i.e., between a word line and a bit line. The functional layer 151 may also be considered as disposed between the semiconductor channel 155 and the conductor/insulator stack 146. A portion of the conductive layer 145 that is around a portion of the channel hole structure 150 functions as a control gate or gate electrode for a NAND memory cell. The 3D memory device 190 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells through the conductor/insulator stack 146 over the substrate 110.

Figure 10:
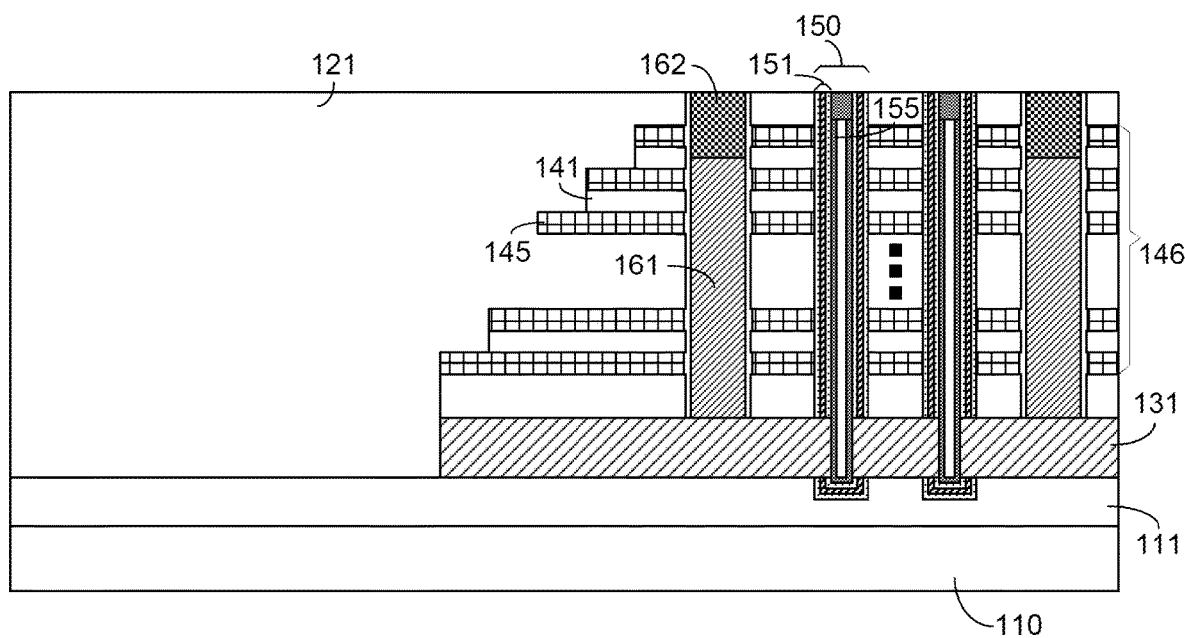

After the conductive layers 145 are grown in the cavities 143, a dielectric layer (e.g., a silicon oxide layer) may be deposited on the sidewalls and bottom surfaces of the gate line slits 160 by CVD and/or ALD. A dry etch process or a combination of dry etch and wet etch processes may be performed to remove the dielectric layer at the bottom of the gate line slits to expose parts of the semiconductor layer 131. In some aspects, the gate line slits may be filled with a conductive material 161 (e.g., doped polysilicon) and a conductive plug 162 (e.g., metal W). Optionally, the gate line slits may also be filled with one conductive material (e.g., doped polysilicon or W). The conductive material 161 in the gate line slit extends through the conductor/insulator stack 146 and contacts the semiconductor layer 131, as shown in FIG. 10. The word "contact" as a verb indicates electrically contacting an object as used herein. The filled gate line slits become an array common source for the 3D memory device 190 in some aspects. Optionally, forming the array common source in the gate line slits includes depositing an insulation layer, a conductive layer (such as TiN, W, Co, Cu, or Al), and then a conductive material such as doped polysilicon.

Figure 11:
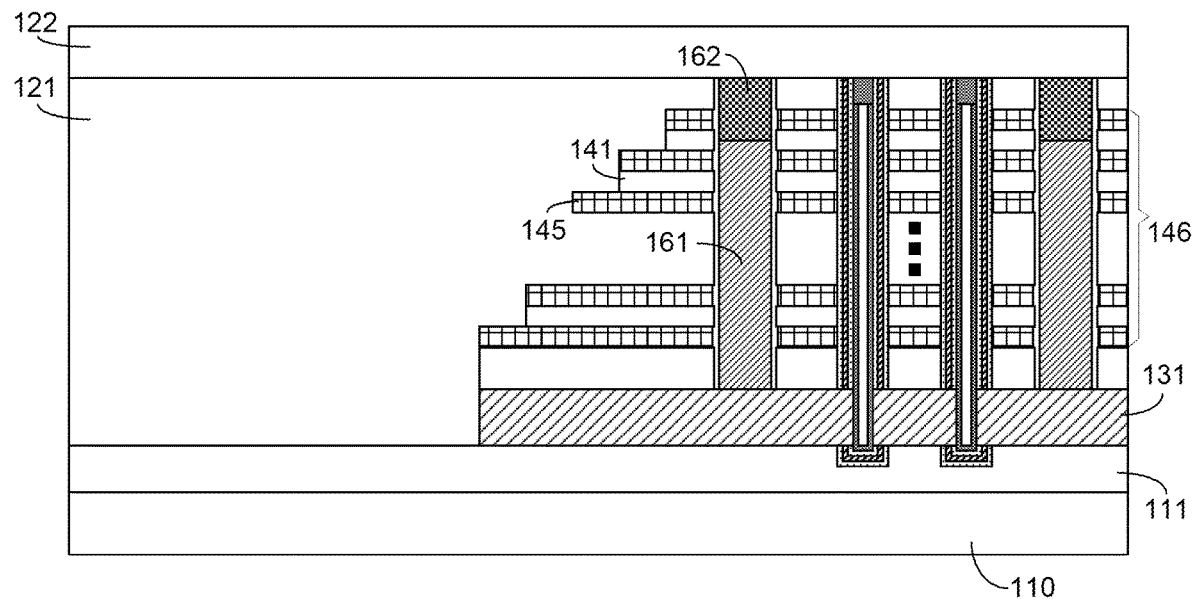
FIGS. 11, 12, and 13 illustrate cross-sectional views of the 3D memory device shown in FIG. 10 at certain stages in the fabrication process according to various aspects of the to present disclosure.
Figure 12:
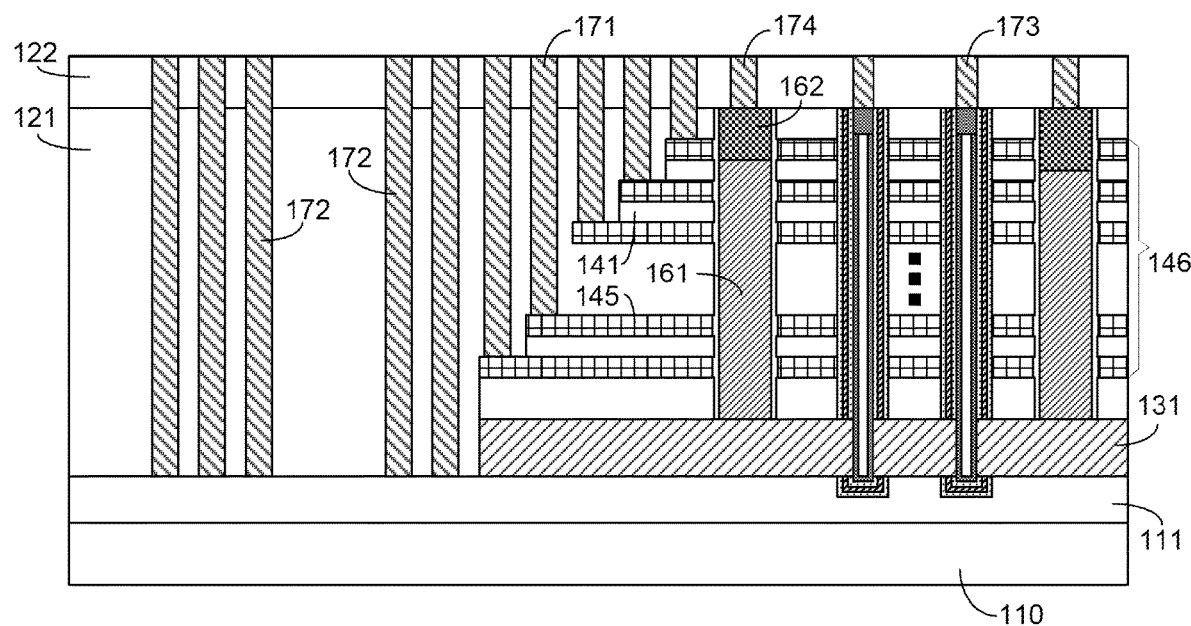

At 1060, etching and deposition processes are performed to form contacts 171-174 with a conductive material. As shown in FIG. 11, a dielectric material is deposited to form a dielectric layer 122 over the layer 121 by CVD, PVD, ALD, or a combination thereof. The layer 122 is also formed over the stack 146 (or the array common source and the NAND memory cells). Further, openings are formed by, e.g., a dry etch process or a combination of dry and wet etch processes. The openings are filled with a conductive material to form interconnect contacts by CVD, PVD, ALD, electroplating, electroless plating, or any combination thereof. As shown in FIG. 12, the word line contacts 171 and through silicon contacts 172 extend through the layers 122 and 121. The contacts 173 pass through the layer 122 and are connected to the upper ends of the NAND strings. The contacts 174 pass through the layer 122 and are connected to the plugs 162 of the array common source. In some aspects, the contacts 172 extend to reach the doped region 111. Alternatively, the contacts 172 may extend to a level above the doped region 111 in the dielectric layer 121. The conductive material of the contacts 171-174 may include W, Co, Cu, Al, or a combination thereof. Optionally, a layer of a conductive material (e.g., TiN) may be deposited as a contact layer before another conductive material is deposited when the contacts 171-174 are fabricated respectively.

Figure 13:
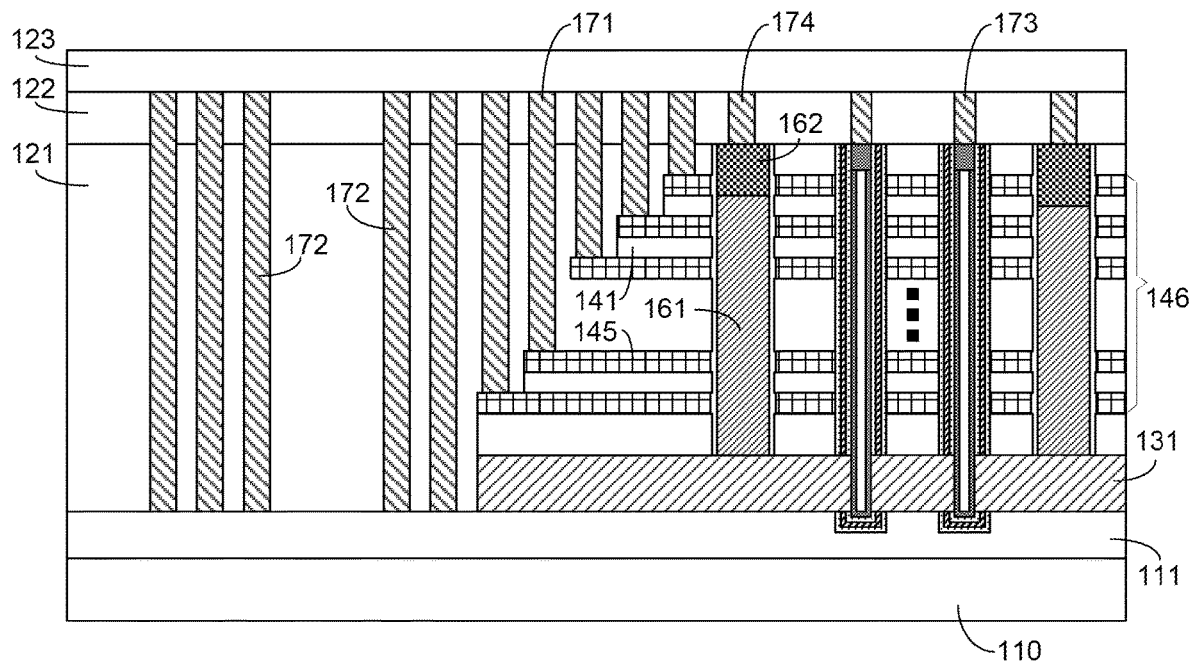

Further at 1060, a CVD and/or ALD process is performed to deposit a dielectric layer 123 over the layer 122. As shown in FIG. 13, the layer 122 is between the layer 123 and the conductor/insulator stack 146. As the layer 122 is thinner than 1-3 micrometers in some cases, the layer 123 may be proximate to the conductor/insulator stack 146, e.g., with a distance shorter than 1-3 micrometers from the stack 146. In some aspects, the dielectric layer 123 may include a dielectric material that contains hydrogen bonds. For example, the dielectric material of the layer 123 may include hydrogenated silicon nitride (SiNx:H). Optionally, the layer 123 may be a SiNx:H layer. The SiNx:H layer may be grown using reactive species such as ammonia (NH3) and silane (SiH4) by PECVD. As used herein, SiNx:H may also be referred to as passivation SiN.

Passivation SiN contains silicon-nitrogen (Si—N) bonds, silicon-hydrogen (Si—H) bonds, and nitrogen-hydrogen (N—H) bonds. As used herein, the term "silicon-nitrogen (Si—N) bond" indicates a chemical bond or covalent bond that holds atomic silicon and atomic nitrogen together, the term "silicon-hydrogen (Si—H) bond" indicates a chemical bond or covalent bond that holds atomic silicon and atomic hydrogen together, and the term "nitrogen-hydrogen (Ni—H) bond" indicates a chemical bond or covalent bond that holds atomic nitrogen and atomic hydrogen together. The Si—H and N—H bonds may also be referred to as hydrogen bonds as used herein. The Si—H and N—H bonds, especially the Si—H bonds, are not strong and can break at certain high temperatures, for example, temperatures higher than 400 degrees Celsius. When temperatures are much higher than 400 degrees Celsius, more Si—H and N—H bonds may break. Breaking of the hydrogen bonds release atomic hydrogen (i.e., hydrogen in its atomic form) from the bonds. That is, passivation SiN may be annealed at certain high temperatures to dissociate Si—H and N—H bonds and release atomic hydrogen from the broken hydrogen bonds. Hence, passivation SiN may be used as an efficient hydrogen source in a thermal process. The released atomic hydrogen may spread in a diffusion process and passivate certain defects (such as dangling bonds and shallow traps) by binding with the defects.

During fabrication of the channel hole structure 150, certain defects may form, such as dangling bonds and shallow traps that are electrically active. For example, dangling bonds may appear in the semiconductor channel 155. In addition, shallow traps may appear in the semiconductor channel 155, the tunneling layer 154, the charge trap layer 153, the interface between the semiconductor channel 155 and tunneling layer 154, and the interface between the tunneling layer 154 and charge trap layer 153. These defects may decrease the electron mobility in the semiconductor channel 155, affect the threshold voltage of a NAND cell, affect switching characteristics, and cause endurance and charge retention issues. Consequently, the performance and reliability of the 3D memory device 190 may be degraded.

To repair the defects, a passivation process may be performed. As illustrated above, the layer 123 is a layer of passivation SiN that contains Si—H bonds and N—H bonds. The Si—H and N—H bonds are not strong and can be dissociated at temperatures higher than 400 degrees Celsius. The broken Si—H and N—H bonds release atomic hydrogen that may diffuse into the conductor/insulator stack 146 (e.g., the semiconductor channels 155 and functional layers 151) and passivate defects there. As higher temperatures break more Si—H and N—H bonds, cause more atomic hydrogen to be released to passivate more defects, 500-800 degrees Celsius may be applied in some thermal processes. However, when temperatures are higher than 450 degrees Celsius, certain complementary metal-oxide semiconductor (CMOS) circuits may be damaged. Thus, even though there is a need for releasing more atomic hydrogen, temperatures are maintained below 450 degrees Celsius when CMOS devices are passivated.

Figure 14:
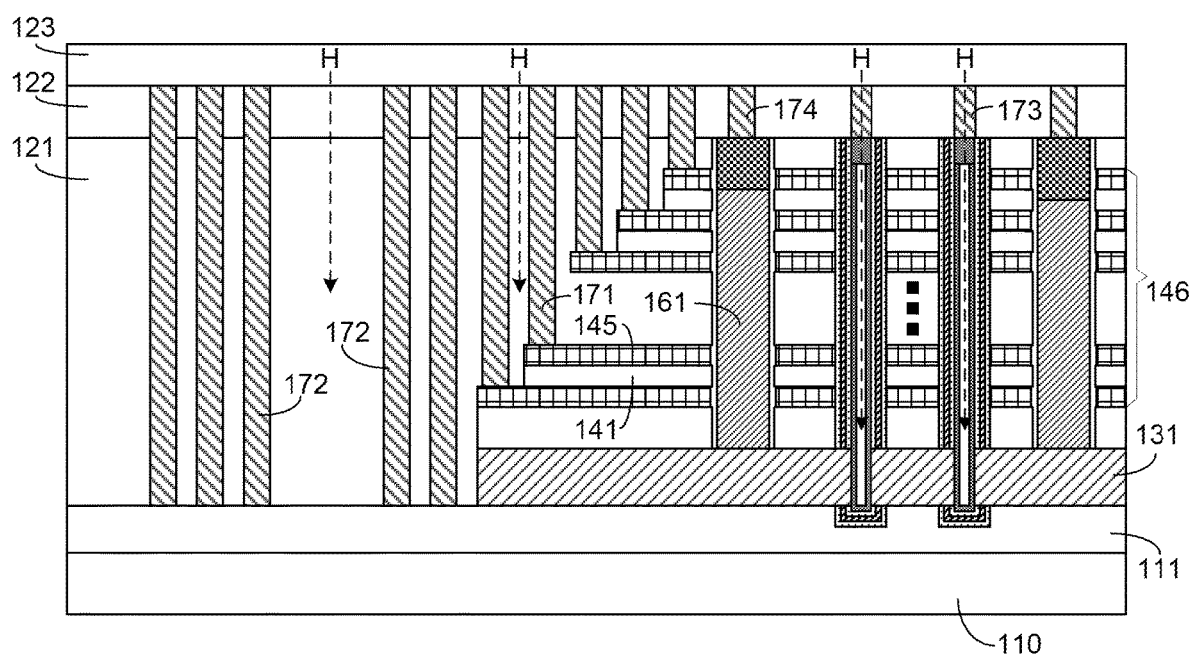
FIG. 14 illustrates a cross-sectional view of the 3D memory device shown in FIG. 13 in a thermal process according to various aspects of the present disclosure.

At 1070, a thermal process is performed in an inert gas (e.g., nitrogen gas) environment. As shown in FIG. 14, the structure of the 3D memory device 190 does not contain any CMOS circuits, and thus the thermal process may take place at temperatures higher than 450 degrees Celsius or much higher than 450 degrees Celsius (e.g., 800 degrees Celsius). Hence more Si—H and N—H bonds may be broken compared to a thermal process with temperatures below 450 degrees Celsius, and more atomic hydrogen may be released. The released atomic hydrogen may diffuse into the conductor/insulator stack 146, e.g., into the semiconductor channels, the tunneling layers, the charge trap layers, and corresponding interfaces between the layers, and passivate more defects through binding with them, respectively. During the thermal process, a certain fraction of the Si—H bonds and a certain fraction of the N—H bonds in the layer 123 may be broken, and the rest Si—H and N—H bonds may remain in the layer 123.

In some aspects, the layer 122 may also be deposited with passivation SiN. In these cases, the layer 122 may work as a hydrogen source as well and it may increase the supply of atomic hydrogen in a thermal process, since both of the layers 122-123 contain passivation SiN.

Figure 15:
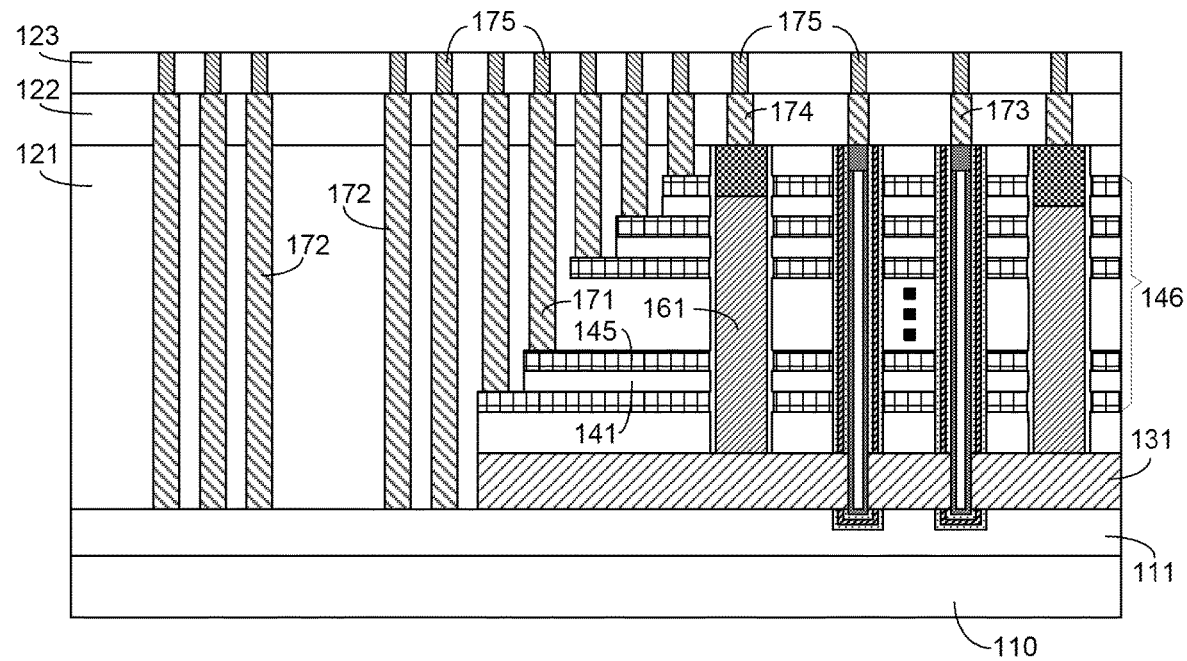
FIGS. 15 and 16 illustrate cross-sectional views of the 3D memory device shown in FIG. 14 at certain stages in the fabrication process according to various aspects of the present disclosure.

At 1080, etching and deposition processes are performed to form vias 175 for interconnect in the passivation SiN layer 123. In some aspects, openings are formed in the layer 123 by, e.g., a dry etch process or a combination of dry and wet etch processes. The openings are filled with a conductive material to form the vias 175 by CVD, PVD, ALD, electroplating, electroless plating, or any combination thereof. As shown in FIG. 15, the vias 175 are fully surrounded horizontally by passivation SiN and proximate to the conductor/insulator stack 146. The vias 175 extend through the layer 123 in a direction approximately perpendicular to the substrate 110, and are connected to the contacts 171-174, respectively. Some of the vias 175 are connected to the NAND cells through the contacts 171 and 173. The conductive material of the vias 175 may include W, Co, Cu, Al, Ti, or a combination thereof. Optionally, a layer of a conductive material (e.g., TiN) may be deposited first before filling the openings to form the vias 175.

Further, conductor layers 176 for interconnect are grown over the passivation SiN layer 123 by CVD, PVD, ALD, electroplating, electroless plating, or a combination thereof. The conductor layers 176 are proximate to the passivation SiN layer 123, e.g., with a distance shorter than 1-3 micrometers from the layer 123 or being in contact with the layer 123. The layer 123 is between the conductor layers 176 and the conductor/insulator stack 146 along a direction approximately perpendicular to the substrate 110. Optionally, some of the conductor layers 176 may be deposited over and contact the vias 175, respectively, and include a conductive material such as W, Co, Cu, Al, Ti, or a combination thereof.

Further, a deposition process such as a CVD and/or PVD is performed. A dielectric material (e.g., silicon oxide or silicon nitride) is deposited to form a dielectric layer 124 over the conductor layers 176 and the dielectric layer 123.

In some cases, passivation SiN is deposited to grow the layer 124. In these cases, the layer 124 may also be used as a hydrogen source for repairing certain defects with atomic hydrogen. For example, a thermal process may be conducted to release atomic hydrogen, diffuse the atomic hydrogen into the NAND memory cells, and heal certain defects in the NAND memory cells after the layer 124 is formed. Further, openings for vias 177 are formed by a dry etch process or a combination of dry and wet etch processes. The openings are subsequently filled with a conductive material such as W, Co, Cu, Al, or a combination thereof to form the vias 177. CVD, PVD, ALD, electroplating, electroless plating, or a combination thereof may be performed. The vias 177 are connected to the conductor layers 176, the vias 175, and the contacts 171-174, respectively. Optionally, a layer of a conductive material (e.g., TiN) may be deposited first before filling the openings to form the vias 177.

Figure 16:
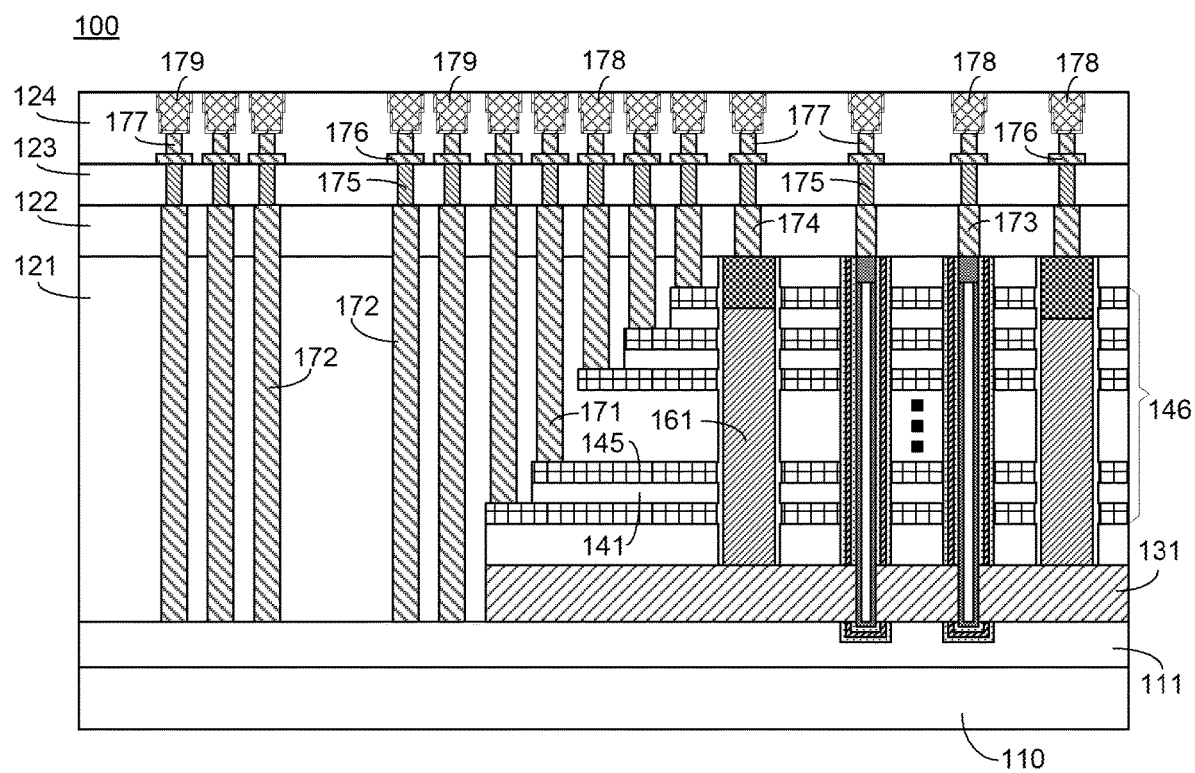

Further, a CVD and/or PVD process is performed to deposit a dielectric material (e.g., silicon oxide or silicon nitride) to cover the vias 177 and thicken the dielectric layer 124. Openings are made and then filled to form connecting pads 178 and 179 that serve as interconnects with a periphery device. The structure of the 3D memory device 190, as shown in FIG. 16, is a part of the device 190 and may be referred to as a 3D array device 100.

The connecting pads 178 are connected to contacts 171, 173, and 174, respectively. The connecting pads 179 are connected to the contacts 172, respectively. The connecting pads 178-179 may include a conductive material such as W, Co, Cu, Al, Ti, or a combination thereof. Optionally, a contact layer of a conductive material (e.g., TiN) may be deposited first before filling the openings to form the connecting pads 178-179.

In some cases, fabrication of the 3D array device 100 may include the following sequence of processes. Referring to FIGS. 10-16, after completing the conductor/insulator stack 146 and the array common source, a deposition process is performed to grow the dielectric layer 122, which may contain silicon oxide or passivation SiN. Next, the contacts 171-174 are made. Then, the passivation SiN layer 123 is deposited using, e.g., PECVD. Optionally, after depositing the layer 123, a thermal process is carried out at predetermined temperatures (e.g., 450-800 degrees Celsius). During the thermal process, atomic hydrogen is released from the passivation SiN layer 123 (or the layers 122-123). The atomic hydrogen then diffuses into and between the NAND cells and passivates defects there. After the thermal process, the vias 175 are deposited in the layer 123, followed by sequentially forming the conductor layers 176, the dielectric layer 124, the vias 177, and the connecting pads 178-179. In some aspects, one or more thermal processes may be carried out at predetermined temperatures to passivate defects after depositing the passivation SiN layer 123. For example, one or more thermal processes may be performed before forming the vias 175, the conductor layers 176, the vias 177, or the connecting pads 178-179. Optionally, one or more thermal processes may be performed after forming the vias 175, the conductor layers 176, the vias 177, or the connecting pads 178-179 and before the 3D array device 100 is bonded with a peripheral device.

Figure 17:
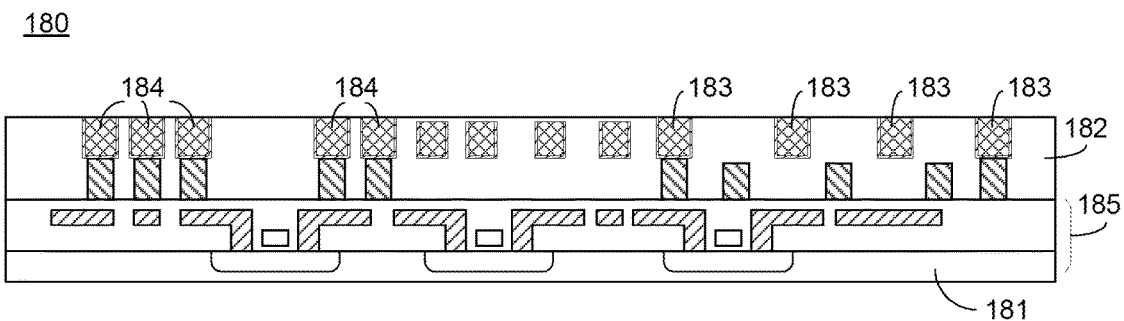
FIG. 17 illustrates a cross-sectional view of an exemplary periphery device including CMOS circuits according to various aspects of the present disclosure.

FIG. 17 shows a schematic cross-sectional view of a periphery device 180 according to aspects of the present disclosure. The periphery device 180 is a part of the 3D memory device 190 and may also be referred to as a peripheral structure. The periphery device 180 includes a substrate 181 that may include single crystalline silicon, Ge, SiGe, SiC, SOI, GOI, polysilicon, or a Group III-V compound such as GaAs or InP. Periphery CMOS circuits 185 (e.g., control circuits) are fabricated on the substrate 181 and used for facilitating the operation of the 3D memory device 190. For example, the periphery CMOS circuits 185 may include metal-oxide-semiconductor field-effect transistors (MOSFETs) and provide functional devices such as page buffers, sense amplifiers, column decoders, and row decoders. A dielectric layer 182 is deposited over the substrate 181 and the CMOS circuits 185. Connecting pads (such as connecting pads 183 and 184) and vias for interconnect are formed in the dielectric layer 182. The dielectric layer 182 includes one or more dielectric materials such as silicon oxide and silicon nitride. The connecting pads 183-184 are formed to connect with the 3D array device 100 and may include a conductive material such as W, Co, Cu, Al, Ti or a combination thereof.

For the 3D array device 100 and periphery device 180, the bottom side of the substrate 110 or 181 may be referred to as the back side, and the side with the connecting pads 178-179 or 183-184 may be referred to as the front side or face side.

Figure 18:
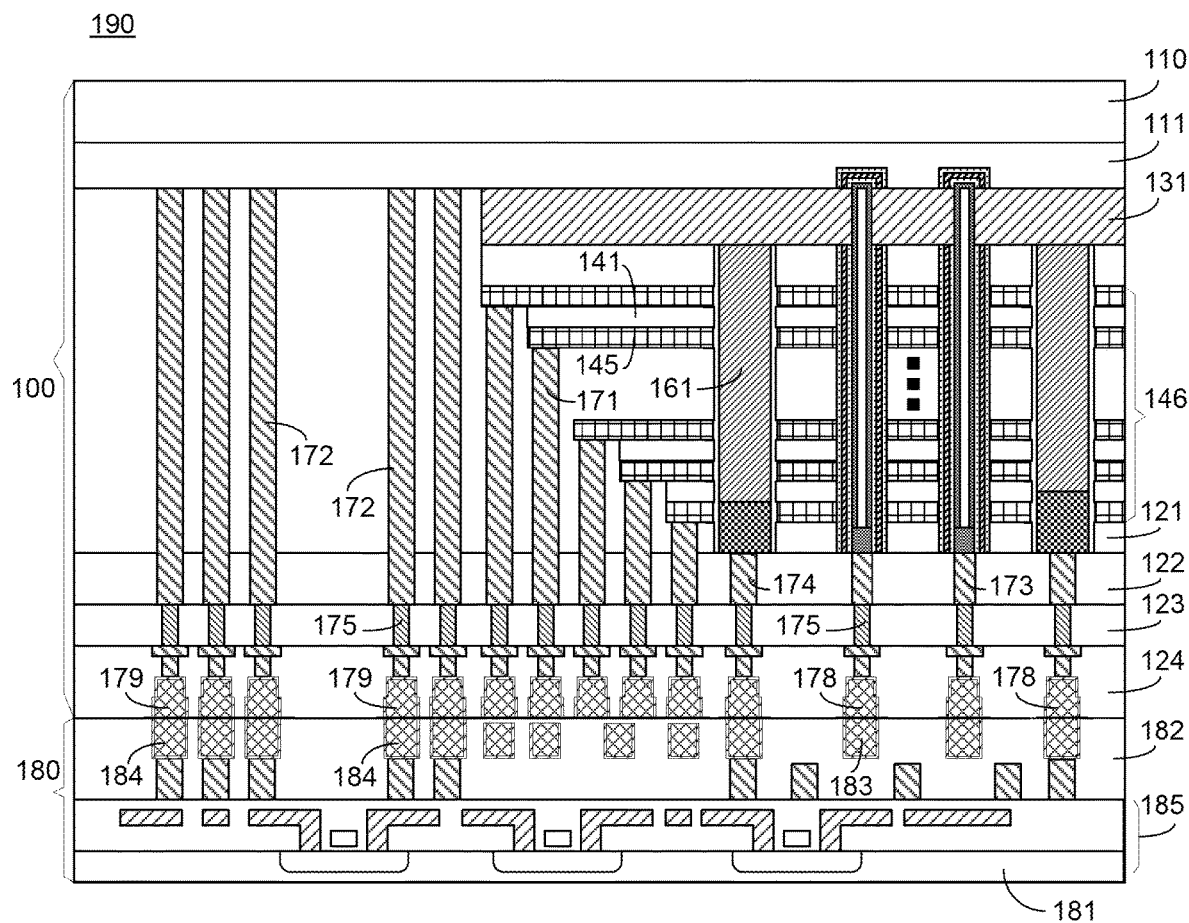
FIG. 18 illustrates a cross-sectional view of the 3D memory device after a 3D array device shown in FIG. 16 is bonded with the periphery device shown in FIG. 17 according to various aspects of the present disclosure.

Further at 1090, a flip-chip bonding process is performed to bond the 3D array device 100 shown in FIG. 16 and the periphery device 180 shown in FIG. 17, which creates the 3D memory device 190. FIG. 18 schematically depicts a cross-sectional view of the 3D memory device 190 according to aspects of the present disclosure.

In some aspects, the 3D array device 100 and periphery device 180 may be bonded by a flip-chip bonding method to form the 3D memory device 190, as shown in FIG. 18. The 3D array device 100 is flipped vertically and becomes upside down with the top surfaces of the connecting pads 178-179 facing downward. The two devices are placed together such that the 3D array device 100 is above the periphery device 180. After an alignment is made, e.g., the connecting pads 178-179 are aligned with the connecting pads 183-184, respectively, the 3D array device 100 and periphery device 180 are joined face to face and bonded together. The conductor/insulator stack 146 and the periphery CMOS circuits 185 become sandwiched between the substrates 110 and 181 or between the doped region 111 and the substrate 181. In some aspects, a solder or a conductive adhesive is used to bond the connecting pads 178-179 with the connecting pads 183-184, respectively. As such, the connecting pads 178-179 are connected to the connecting pads 183-184, respectively. The 3D array device 100 and periphery device 180 are in electrical communication after the flip-chip bonding process is completed. Some of the vias 175 are connected to the periphery circuits 185 through the connecting pads 183-184 and 178-179.

Further, other fabrication steps or processes are performed to complete fabrication of the 3D memory device 190. The other fabrication steps and processes are not reflected in FIG. 18 for simplicity. For example, from the bottom surface (after the flip-chip bonding), the substrate 110 of the 3D array device 100 is thinned by a thinning process, such as wafer grinding, dry etch, wet etch, CMP, or a combination thereof. A dielectric layer is grown over the doped region 111 by a deposition process (e.g., a CVD or PVD process). With similar methods as described above, vias and conductor layers are formed that connect the contacts 172, respectively. Further, contact pads (not shown) are formed that connect some of the contacts 172. These contact pads are made for wire bonding for connecting with other devices. Further, additional fabrication steps or processes are performed. Details of the additional fabrication steps or processes are omitted for simplicity.

As shown in FIG. 18, the passivation SiN layer (e.g., the layer 123 or layers 122-123) is formed between the stack 146 (or the NAND cells) and the connecting pads 178-179, or between the stack 146 (or the NAND cells) and the periphery circuits 185. As illustrated above, the passivation SiN layer provides a hydrogen diffusion source for passivation of defects, and a thermal process is performed before the array device 100 and periphery device 180 are assembled together. High temperatures, such as temperatures higher than 450 degrees Celsius, can degrade the performance of the periphery CMOS circuits 185. Since the periphery device 180 is not involved during the thermal process, the periphery CMOS circuits are not affected by the high temperatures. Thus, temperatures higher than 450 degrees Celsius may be applied to release atomic hydrogen. When temperatures over 450 degrees Celsius, instead of below 450 degrees Celsius, are applied, more atomic hydrogen may be released for diffusion. As more atomic hydrogen diffuses into the conductor/insulator stack 146, more defects may be passivated. Hence, compared to a thermal process with temperatures below 450 degrees Celsius, a thermal process with temperatures higher than 450 degrees Celsius may improve the performance and reliability of the 3D memory device 190.

Figure 19:
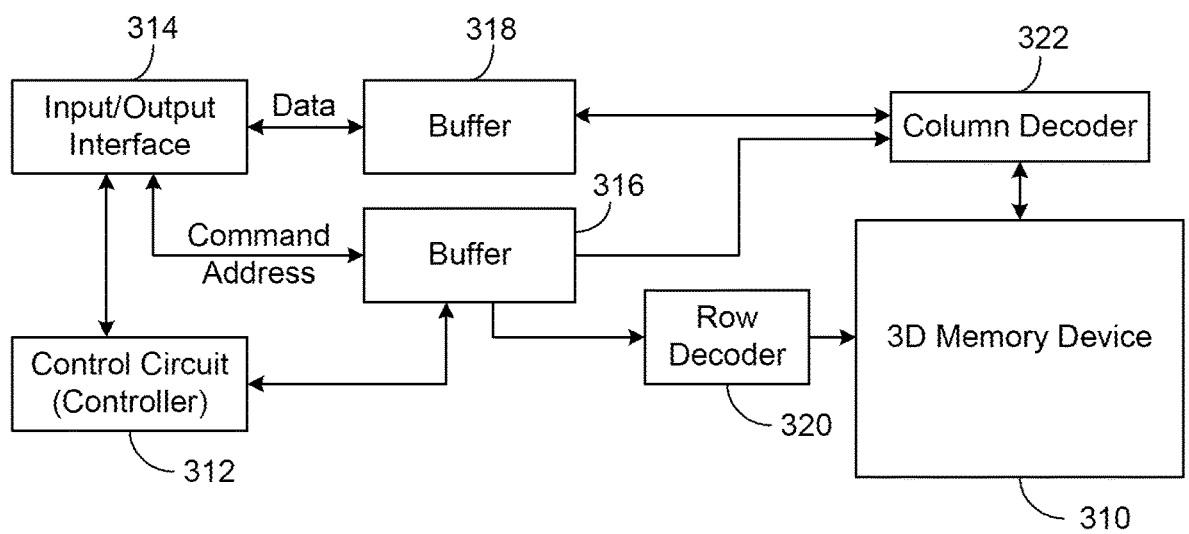
FIG. 19 illustrates a block diagram of a memory apparatus according to various embodiments of the present disclosure.

FIG. 19 shows a block diagram of a memory apparatus 300 according to embodiments of the present disclosure. Examples of the memory apparatus 300 may include data storage devices such as a solid-state drive (SSD), a universal flash storage (UFS) memory device, a multimedia card (MMC), an embedded multimedia card (eMMC), etc. The memory apparatus 300 may contain a 3D memory device such as the 3D memory device 190 illustrated above and shown in FIG. 18. As the 3D memory device 190 has improved performance and reliability due to a thermal process with temperatures over 450 degrees Celsius, when the device 190 is used, the memory apparatus 300 may have improved performance and reliability, as well. As shown in FIG. 19, the memory apparatus 300 contains a 3D memory device 310 (e.g., the device 190) and a control circuit 312 that functions as a controller of the memory apparatus 300. The 3D memory device 310 may include one or more 3D array devices (e.g., the 3D array device 100). The memory apparatus 300 further contains an input/output (I/O) interface 314, a buffer 316, a buffer 318, a row decoder 320, and a column decoder 322. The control circuit 312 implements various functions of the memory apparatus 300. For example, the control circuit 312 may implement read operations, write operations, and erase operations. The I/O interface 314, which may also be referred to as an I/O component or I/O connections, contains an I/O circuit to receive an input of command signals, address signals, and data signals to the memory apparatus 300 and transmit data and status information from the memory apparatus 300 to another device (e.g., a host device). The buffer 316 buffers or temporarily stores command/address signals, while the buffer 318 buffers or temporarily stores data signals. Optionally, the buffers 316 and 318 may be combined into a single buffering device. The row decoder 320 and column decoder 322 decode row and column address signals respectively for accessing the 3D memory device 310. The I/O interface 314 detects command signals, address signals, and data signals from the input. In some cases, the I/O interface 314 may transmit command and/or address signals to the buffer 316, and transmit data signals to the buffer 318. For simplicity, other components and functions of the memory apparatus 300 are omitted.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A method for fabricating a three-dimensional (3D) memory device, comprising:
    forming a conductor/insulator stack over a substrate;
    forming a dielectric layer of a dielectric material including atomic hydrogen over the conductor/insulator stack;
    forming a plurality of semiconductor channels through the conductor/insulator stack; and
    performing a thermal process to release the atomic hydrogen from the dielectric material and diffuse the atomic hydrogen into the conductor/insulator stack, wherein the plurality of semiconductor channels contains atomic hydrogen.

2. The method according to claim 1, wherein the dielectric material includes hydrogenated silicon nitride.

3. The method according to claim 1, wherein the atomic hydrogen is released from a plurality of hydrogen bonds of the dielectric material.

4. The method according to claim 3, wherein the plurality of hydrogen bonds include a silicon-hydrogen (Si—H) bond and/or a nitrogen-hydrogen (N—H) bond.

5. The method according to claim 1, further comprising:
    diffusing the atomic hydrogen into the conductor/insulator stack to passivate a plurality of defects in the conductor/insulator stack by binding the atomic hydrogen with the plurality of defects, respectively.

6. The method according to claim 1, further comprising:
    forming a plurality of vias that extend through the dielectric layer for interconnect.

7. The method according to claim 6, further comprising:
    forming a plurality of conductor layers over the plurality of vias for interconnect.

8. The method according to claim 6, wherein the thermal process is performed before forming the plurality of vias.

9. The method according to claim 6, wherein the thermal process is performed before bonding an 3D array device with a peripheral device to form the 3D memory device, the 3D array device and peripheral device including the conductor/insulator stack and a complementary metal-oxide semiconductor (CMOS) circuit, respectively.

10. A three-dimensional (3D) memory device, comprising:
    a conductor/insulator stack;
    a dielectric layer of a dielectric material including atomic hydrogen disposed over the conductor/insulator stack;
    a plurality of semiconductor channels through the conductor/insulator stack and containing atomic hydrogen; and
    a plurality of vias through the dielectric layer.

11. The 3D memory device according to claim 10, wherein the dielectric material includes hydrogenated silicon nitride.

12. The 3D memory device according to claim 10, wherein the dielectric material includes a plurality of hydrogen bonds that release atomic hydrogen in a thermal process.

13. The 3D memory device according to claim 12, wherein the plurality of hydrogen bonds include a silicon-hydrogen (Si—H) bond and/or a nitrogen-hydrogen (N—H) bond.

14. The 3D memory device according to claim 10, further comprising:
    functional layers formed through the conductor/insulator stack and between the conductor/insulator stack and a semiconductor channel of the plurality of semiconductor channels, wherein the functional layers further contain atomic hydrogen.

15. The 3D memory device according to claim 12, further comprising:
    a periphery device bonded with a 3D array device that includes the conductor/insulator stack, the periphery device including a complementary metal-oxide semiconductor (CMOS) circuit that facilitates an operation of the 3D memory device.

16. The 3D memory device according to claim 14, wherein the functional layers include a blocking layer adjacent to the conductor/insulator stack, a charge trap layer on the blocking layer, and a tunneling layer on the charge trap layer.

17. A memory apparatus, comprising:
    an input/output (I/O) component for receiving an input;
    a buffer for buffering a signal;
    a controller for implementing an operation; and
    a three-dimensional (3D) memory device, the 3D memory device comprising:
        a conductor/insulator stack;
        a dielectric layer of a dielectric material including atomic hydrogen disposed over the conductor/insulator stack;
        a plurality of semiconductor channels through the conductor/insulator stack and containing atomic hydrogen; and
        a plurality of vias through the dielectric layer.

18. The memory apparatus according to claim 17, wherein the dielectric material includes hydrogenated silicon nitride.

19. The memory apparatus according to claim 17, wherein the dielectric material includes a plurality of hydrogen bonds that release atomic hydrogen in a thermal process.

20. The memory apparatus according to claim 17, wherein the 3D memory device further includes:
    a plurality of conductor layers proximate to the dielectric layer, the dielectric layer being between the plurality of conductor layers and the conductor/insulator stack.

* * * * *